(12) United States Patent
Kim

(10) Patent No.: US 6,933,728 B2
(45) Date of Patent: Aug. 23, 2005

(54) METHOD AND APPARATUS FOR MEASURING VOLTAGE OF BATTERY MODULE OF ELECTRIC VEHICLE

(75) Inventor: Tae Woo Kim, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 162 days.

(21) Appl. No.: 10/670,887

(22) Filed: Sep. 24, 2003

(65) Prior Publication Data

US 2004/0174170 A1 Sep. 9, 2004

(30) Foreign Application Priority Data

Mar. 5, 2003 (KR) ................................. 10-2003-0013601

(51) Int. Cl.⁷ ........................................... G01N 27/416
(52) U.S. Cl. ...................................................... 324/433
(58) Field of Search .................................. 324/426, 433; 320/132, 134, 136; 340/636.1, 636.15, 660, 661

(56) References Cited

U.S. PATENT DOCUMENTS

| | | | | |
|---|---|---|---|---|
| 5,196,833 A | * | 3/1993 | Kemp | ......................... 340/663 |
| 5,736,831 A | * | 4/1998 | Harrington | ................... 320/104 |
| 5,808,469 A | * | 9/1998 | Kopera | ........................ 324/434 |
| 5,945,829 A | * | 8/1999 | Bertness | ...................... 324/430 |
| 6,313,637 B1 | | 11/2001 | Lino et al. | |

FOREIGN PATENT DOCUMENTS

| | | |
|---|---|---|
| JP | 2000-088898 | 3/2000 |
| JP | 2002-139522 | 5/2002 |
| JP | 2002-199510 | 7/2002 |

* cited by examiner

*Primary Examiner*—Edward H. Tso
(74) *Attorney, Agent, or Firm*—Morgan Lewis & Bockius LLP

(57) ABSTRACT

While measuring a value of a battery module voltage of an electric vehicle using a differential amplifier circuit having at least one resistor, an actual effective gain of the differential amplifier circuit depending on the resistivity of the resistor is measured and the output voltage of the differential amplifier is modified based on the actual effective gain to calculate the battery module voltage. In this way, accuracy of measuring the battery module voltage is enhanced.

16 Claims, 3 Drawing Sheets

METHOD AND APPARATUS FOR MEASURING VOLTAGE OF BATTERY MODULE OF ELECTRIC VEHICLE

CROSS-REFERENCE TO RELATED APPLICATIONS

This application claims priority of Korean Application No. 10-2003-0013601, filed on Mar. 5, 2003, the disclosure of which is incorporated fully herein by reference.

FIELD OF THE INVENTION

Generally, the present invention relates to an electric vehicle. More particularly the present invention relates to a method and apparatus for measuring voltage of a battery module of an electric vehicle.

BACKGROUND OF THE INVENTION

As is well known in the art, electric vehicles operable by the power of a battery include a pure electric vehicle operable by the battery power only, and a hybrid electric vehicle that uses both a conventional internal combustion engine and a battery as power sources. A battery used for storing electric energy is provided for such an electric vehicle, and such a battery should be maintained in a proper state. For the purpose of the maintenance, detection of an output voltage of the battery should be enabled. A battery of an electric vehicle usually includes a plurality of modules (battery modules), and accordingly, a voltage of each of the battery modules should be observed in order to detect the output voltage of the battery. In order to properly maintain the battery, it is important to improve preciseness and accuracy in detection of the battery voltage.

One attempt at improving precision in detection of the battery voltage is described in a Laid Open Publication of Japanese Patent application No. 1996-292215, where the improvement of the precision is suggested to be achieved by enhancing resolution of an A/D converter that converts an analogue voltage signal to a digital signal. However, such a scheme does not help improve the accuracy in detection of the battery voltage, which is the motivation of the present invention. In order to measure the voltage of a battery module, a differential amplifier circuit having a differential amplifier is usually adopted. At least one resistor is provided in such a differential amplifier circuit, such that the differential amplifier circuit modifies a voltage difference inputted via input terminals on the basis of a gain according to resistivity of the resistor and outputs the modified voltage difference.

The word "amplify" or variations such as "amplifier" or "amplification" used in an expression such as "differential amplifier" should be understood to cover both the meanings of "increase" and "decrease" of a signal level. It is notable that an increase or decrease of a signal level may be obviously changed therebetween by changing the value of the gain, and the word "amplify" or its variation in the conventional expression "differential amplifier" is kept for better comprehension of the description and claims of the present invention.

A controller is connected to output terminals of the differential amplifier circuit, and the controller stores resistivity value of the resistor used in the differential amplifier circuit as a constant value.

Accordingly, when voltages of both terminals of a battery module are applied to the input terminals of the differential amplifier circuit, the differential amplifier circuit modifies the input voltage and outputs it to the controller. Then, the controller modifies the received voltage difference on the basis of the gain according to the stored constant resistivity value, and determines such recovered voltage difference value as an original voltage difference value received at the differential amplifier circuit, i.e., actual voltage of the battery module.

However, the resistivity value stored in the controller may have errors in comparison with actual resistivity of the resistor used in the differential amplifier circuit, thereby causing deterioration of accuracy in detection of the battery voltage. Such an error may be caused by tolerance of the resistor allowed in manufacturing of the resistor, or by temperature dependency of the resistivity of the resistor. That is, actual resistivity of a resistor may be different from the specification within an allowed tolerance. The actual resistivity may also be different from the specification because the actual resistivity depends on its operating temperature. Accordingly, voltage value of the battery obtained by the differential amplifier circuit may vary according to the operating temperature of the differential amplifier circuit.

The information disclosed in this Background of the Invention section is only for enhancement of understanding of the background of the invention and should not be taken as an acknowledgement or any form of suggestion that this information forms the prior art that is already known to a person skilled in the art.

SUMMARY OF THE INVENTION

The motivation for the present invention is to provide a method and apparatus for measuring a battery module voltage of an electric vehicle having a nonlimiting advantage of enhanced accuracy. An exemplary apparatus for measuring a battery module voltage according to an embodiment of the present invention is an apparatus for measuring the voltage of the battery module included in a battery of an electric vehicle. The exemplary apparatus includes a differential amplifier circuit, an auxiliary power source, first and second switching circuits, and a controller.

The differential amplifier circuit has input terminals and at least one resistor and outputs a modified voltage difference, wherein the modified voltage difference is obtained by modifying a voltage difference inputted through the input terminals on the basis of a gain according to the resistivity of the at least one resistor. The auxiliary power source outputs a reference voltage.

The first switching circuit control applies the battery module voltage to the input terminals, and the second switching circuit control applies the auxiliary power source to the input terminals.

The controller calculates the value of the battery module voltage on the basis of an output voltage from the differential amplifier circuit by detecting a variable effective gain of the differential amplifier circuit; applying the battery module voltage to the input terminals of the differential amplifier circuit; detecting the output voltage of the differential amplifier circuit that is applied with the battery module voltage; and calculating the value of the battery module voltage by modifying the output voltage of the differential amplifier circuit on the basis of the effective gain.

It is preferable that detection of a variable effective gain is realized by switching the first switching circuit OFF (SC1-OFF) and switching the second switching circuit ON (SC2-ON), detecting an output voltage of the differential amplifier circuit in the state of SC1-OFF and SC2-ON, and calculating the effective gain of the differential amplifier circuit on the basis of the detected output voltage. In this case, it is further preferable that the calculation of the effective gain calculates the effective gain as a value obtained by dividing the output voltage of the differential amplifier circuit by the reference voltage.

It is also preferable that the application of the battery module voltage switches the first switching circuit ON (SC1-ON) and the second switching circuit OFF (SC2-OFF). In this case, it is further preferable that the first switching circuit includes a capacitor, a first switch for controlling the connection between the capacitor and the battery module, and a second switch for controlling the connection between the capacitor and the input terminals, and that the application of the battery module voltage is realized by switching the first switch ON (SW1-ON) and the second switch OFF (SW2-OFF), waiting for a predetermined period in the state of SW1-ON and SW2-OFF, and switching the first switch OFF (SW1-OFF) and the second switch ON (SW2-ON).

It is also preferable that calculation of the value of the battery module voltage calculates the effective gain as a value obtained by multiplying the output voltage of the differential amplifier circuit by the effective gain.

It is also preferable that the apparatus for measuring the battery module voltage further includes a power-key for controlling the supply of electric power to an electric load (e.g., a motor) of the electric vehicle, such that the controller detects the effective gain of the differential amplifier circuit at least when the power-key is turned on.

It is also preferable that the apparatus for measuring the battery module voltage further includes a temperature detector for detecting a temperature of the differential amplifier circuit. In this case, the controller may detect the temperature of the differential amplifier circuit and compare the detected temperature with a predetermined temperature, and the detection of the effective gain is performed at least when the detected temperature is above the predetermined temperature.

It is also preferable that the differential amplifier circuit includes a differential amplifier, the input terminals of the differential amplifier circuit includes first and second input terminals, the first and second input terminals of the differential amplifier circuit are connected to first and second terminals of the differential amplifier interposing first and second resistors respectively, an output terminal of the differential amplifier is connected to the first input terminal interposing a third resistor, and the second input terminal of the differential amplifier is grounded interposing a fourth resistor.

An exemplary method for measuring the battery module voltage may be realized by the above described apparatus.

That is, the exemplary method is a method for measuring a voltage of a battery module included in a modularized battery of an electric vehicle, and uses a differential amplifier circuit for outputting a modified voltage difference, wherein the differential amplifier has input terminals and at least one resistor and the modified voltage difference is obtained by modifying a voltage difference inputted through the input terminals on the basis of a gain according to the resistivity of the at least one resistor. Such exemplary method includes detecting a variable effective gain of the differential amplifier circuit, applying the battery module voltage to the input terminals of the differential amplifier circuit, detecting the output voltage of the differential amplifier circuit that is applied with the battery module voltage, and calculating the value of the battery module voltage by modifying the output voltage of the differential amplifier circuit on the basis of the effective gain.

It is preferable that detection of the effective gain is realized by applying the reference voltage to the input terminals of the differential amplifier circuit, detecting an output voltage of the differential amplifier circuit while the reference voltage is applied, and calculating the effective gain of the differential amplifier circuit on the basis of the detected output voltage. In this case, it is further preferable that the calculation of the effective gain calculates the effective gain as a value obtained by dividing the output voltage of the differential amplifier circuit by the reference voltage.

It is also preferable that application of the battery module voltage includes using a capacitor, a first switch for controlling the connection between the capacitor and the battery module, and a second switch for controlling the connection between the capacitor and the input terminals. In this case, application of the battery module voltage preferably includes switching the first switch ON (SW1-ON) and the second switch OFF (SW2-OFF), waiting for a predetermined period in the state of SW1-ON and SW2-OFF, and switching the first switch OFF (SW1-OFF) and the second switch ON (SW2-ON).

It is also preferable that calculation of the value of the battery module voltage calculates the effective gain as a value obtained by multiplying the output voltage of the differential amplifier circuit by the effective gain.

It is also preferable that the exemplary method further includes determining if a power-key for controlling supplying of electric power to an electric load of the electric vehicle is turned on such that the controller detects the effective gain of the differential amplifier circuit at least when the power-key is turned on.

It is also preferable that the exemplary method further includes detecting the temperature of the differential amplifier circuit and comparing the detected temperature with a predetermined temperature such that detection of the effective gain is performed at least when the detected temperature is above the predetermined temperature.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
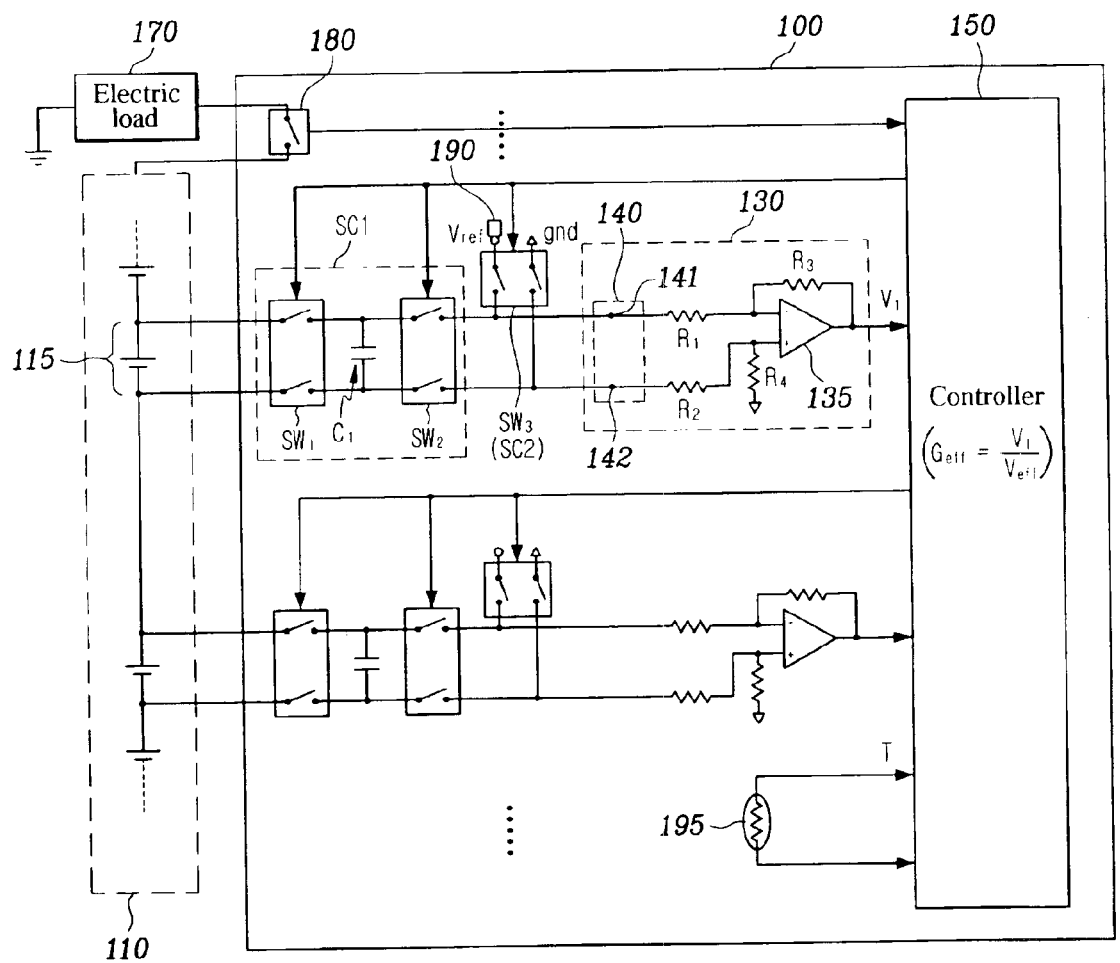
FIG. 1 is a schematic diagram of an apparatus for measuring a battery module voltage of an electric vehicle according to a preferred embodiment of the present invention.

A preferred embodiment of the present invention will hereinafter be described in detail with reference to the accompanying drawings. FIG. 1 is a schematic diagram of an apparatus for measuring a battery module voltage of an electric vehicle according to a preferred embodiment of the present invention. An apparatus 100 for detecting a battery module voltage of an electric vehicle according to a preferred embodiment of the present invention detects a voltage value of a battery module 115 included in a modularized battery 110 of an electric vehicle. As shown in FIG. 1, the apparatus 100 for detecting a battery module voltage of an electric vehicle according to a preferred embodiment of the present invention includes a differential amplifier circuit 130, an auxiliary power source 190, first and second switching circuits SC1 and SC2, and a controller 150.

The differential amplifier circuit 130 has input terminals 140 and resistors R1, R2, R3, and R4. The differential amplifier circuit 130 modifies a voltage difference inputted through the input terminals 140 on the basis of a gain according to the resistivity of the resistors R1, R2, R3, and R4, and outputs the modified voltage difference.

The auxiliary power source 190 outputs a reference voltage Vref. The first switching circuit SC1 controls application of the voltage of the battery module 115 to the input terminals 140. The second switching circuit SC2 controls application of the voltage of the auxiliary power source 190 to the input terminals 140. The controller 150 calculates the value of the battery module voltage on the basis of an output voltage from the differential amplifier circuit 130.

In addition, the apparatus 100 further includes a temperature detector 195 for detecting a temperature of the differential amplifier circuit 130 and a power-key 180 for controlling supplying of electric power of the battery 110 to an electric load 170 of the electric vehicle.

The differential amplifier circuit 130 may be realized in a variety of fashions. For example, in this embodiment, the differential amplifier circuit 130 includes a differential amplifier 135. The input terminals 140 of the differential amplifier circuit 130 include first and second input terminals 141 and 142. The first and second input terminals 141 and 142 of the differential amplifier circuits 130 are connected to first and second terminals of the differential amplifier interposing first and second resistors R1 and R2, respectively. An output terminal of the differential amplifier 135 is connected to the first input terminal 141 interposing a third resistor R3, and the second input terminal of the differential amplifier 135 is grounded interposing a fourth resistor R4. In this case, a gain of the differential amplifier circuit 130 becomes "−R3/R1". The resistivity values of the first and second resistors R1 and R2 are preferably a few mega-ohms (Mohm), and those of the third and fourth resistors R3 and R4 are preferably a few tens of kilo-ohms (kohm).

The value of the reference voltage Vref of the auxiliary power source 190 may be arbitrarily and obviously chosen by a person in the art considering the electric load of each of the circuital elements included in the differential amplifier circuit 130.

As shown in FIG. 1, the first switching circuit SC1 is interposed between the battery module 115 and the input terminals 140 of the differential amplifier circuit 130, and the second switching circuit SC2 is interposed between the auxiliary power source 190 and the input terminals 140 of the differential amplifier circuit 130. According to this scheme, the battery module 115 and the auxiliary power source 190 are connected to the input terminals 140 of the differential amplifier circuit 130, in parallel to each other.

The first switching circuit SC1 includes a capacitor C1, a first switch SW1 for controlling the connection between the capacitor C1 and the battery module 15, and a second switch SW2 for controlling the connection between the capacitor C1 and the input terminals 140. The first switch SW1 includes a pair of switches respectively interposed between terminals of the capacitor C1 and terminals of the battery module 115, and the second switch SW2 includes a pair of switches respectively interposed between terminals of the capacitor C1 and the input terminals 140. The second switching circuit SC2 includes a third switch SW3 that includes a pair of switches respectively interposed between terminals of the auxiliary power source 190 and the input terminals 140.

The temperature detector 195 may be arbitrarily and obviously chosen by a person in the art to detect the temperature of the differential amplifier circuit 130.

The power-key 180 that controls usage of the electric power of the battery 110 is also obvious to a person in the art.

The controller 150 can be realized by one or more processors activated by predetermined software, and the predetermined software can be programmed to perform each step of a method for measuring a battery module voltage according to a preferred embodiment of this invention.

Figure 2:
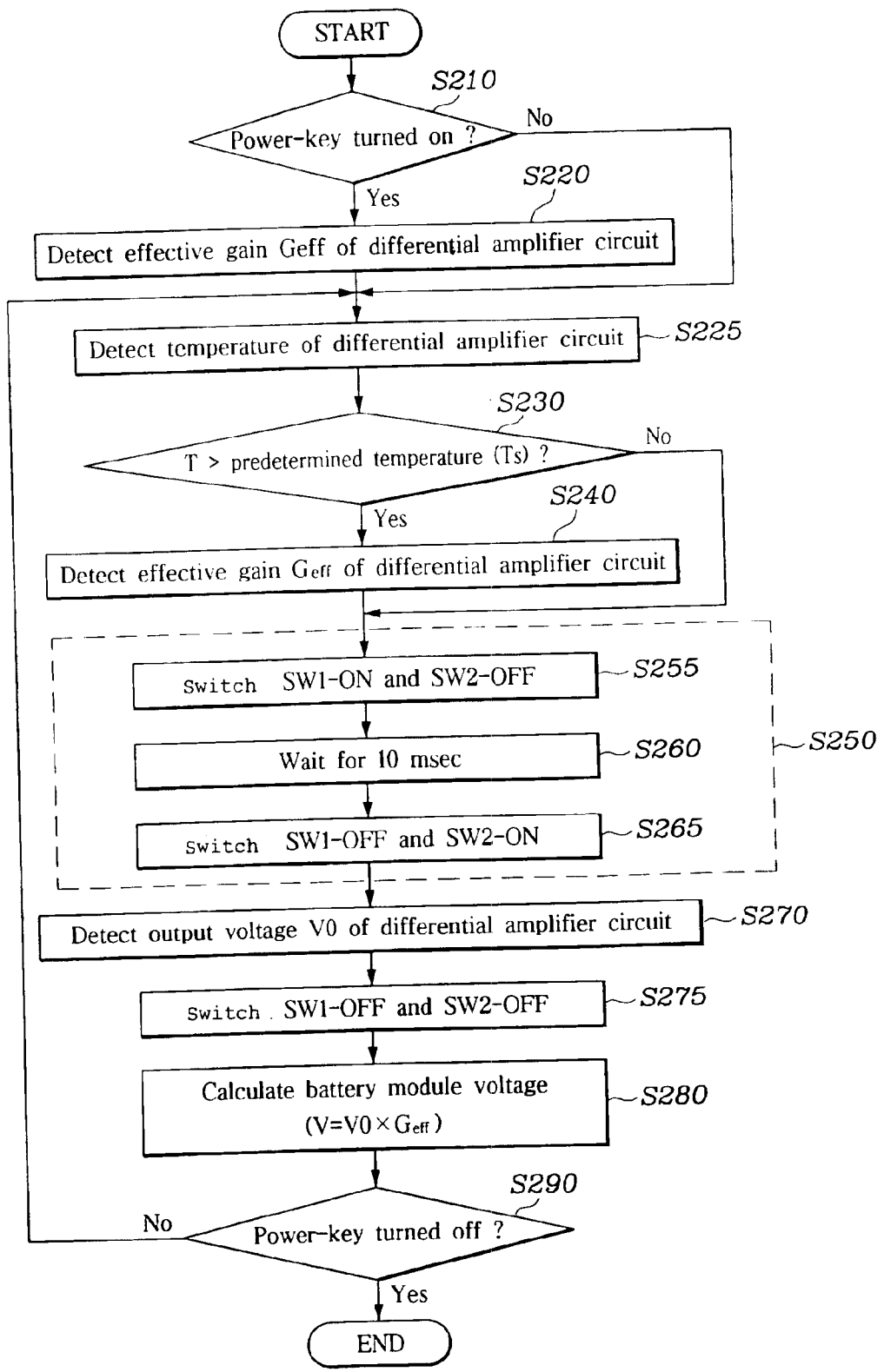
FIG. 2 is a flowchart showing a method for measuring a battery module voltage of an electric vehicle according to a preferred embodiment of the present invention.

A method for measuring a battery module voltage according to a preferred embodiment of this invention is hereinafter described in detail with reference to FIG. 2. As shown in FIG. 2, the method of the present embodiment is performed by the controller 150, and includes detecting a variable effective gain Geff of the differential amplifier circuit 130 at S220 and S240, applying the battery module voltage to the input terminals 140 of the differential amplifier circuit 130 at step S250, detecting the output voltage of the differential amplifier circuit 130 that is applied with the battery module voltage at step S270, and calculating the value of the battery module voltage by modifying the output voltage of the differential amplifier circuit 130 on the basis of the effective gain Geff.

The method for measuring a battery module voltage according to the present embodiment is hereinafter described in further detail.

Firstly at step S210, the controller 150 determines whether the power-key 180 of the electric vehicle is turned on. When the power-key 180 is turned on, the controller 150 detects variable effective gain Geff of the differential amplifier circuit 130 at step S220.

Figure 3:
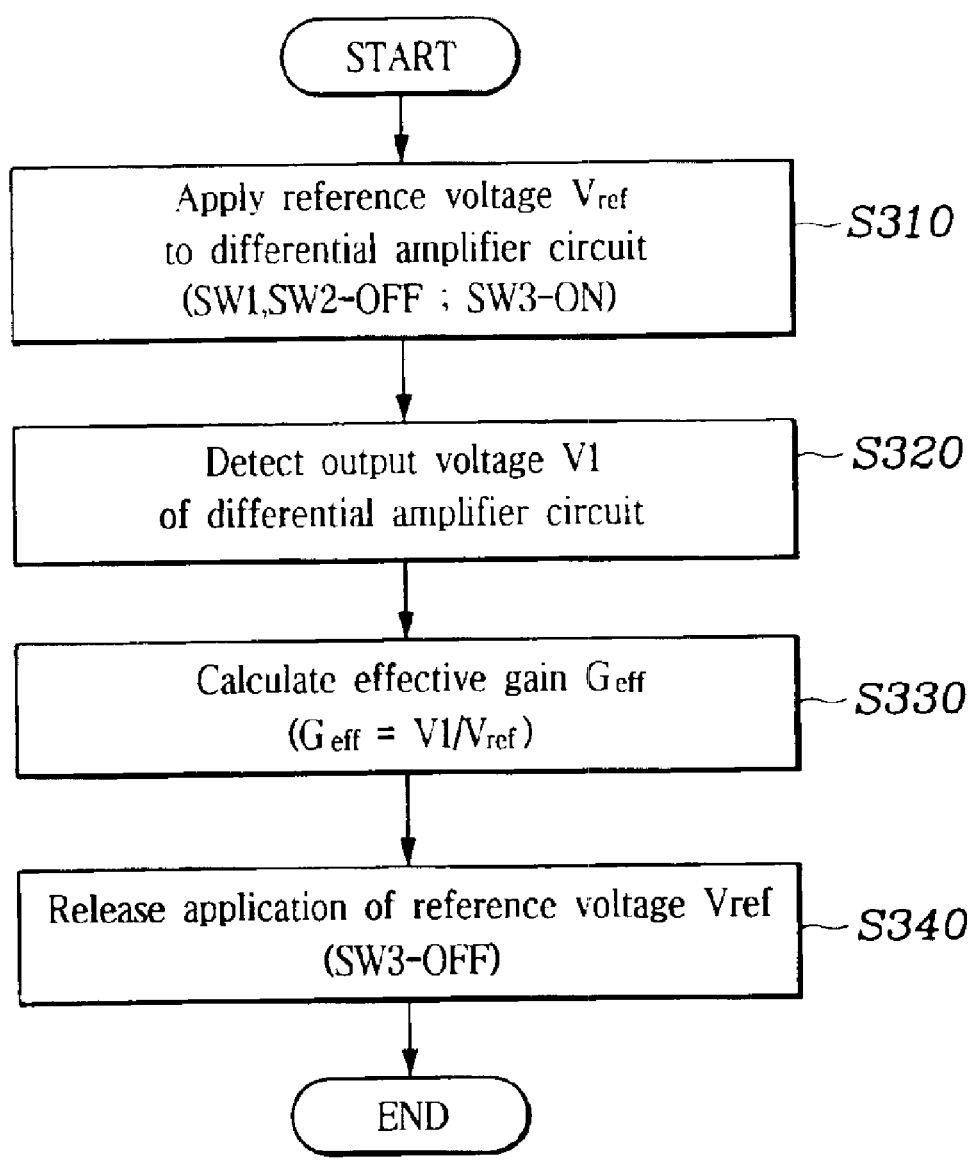
FIG. 3 is a flowchart showing detailed steps of detecting an effective gain in a method for measuring a battery module voltage of an electric vehicle according to a preferred embodiment of the present invention.

Step S220 for detecting of the effective gain Geff, as shown in FIG. 3, includes a step S310 of applying the reference voltage Vref to the input terminals 140 of the differential amplifier circuit 130, a step S320 of detecting an output voltage V1 of the differential amplifier circuit 130 while the reference voltage Vref is applied, and a step S330 of calculating the effective gain Geff of the differential amplifier circuit 130 on the basis of the detected output voltage V1. The step S310 of applying the reference voltage Vref to the input terminals 140 of the differential amplifier circuit 130 is achieved by switching the first switching circuit SC1 OFF (SC1-OFF) and the second switching circuit SC2 ON (SC2-ON). When the first switching circuit SC1 is OFF in step S310, it is preferable that the two switches SW1 and SW2 are both switched OFF. At step S330 of calculating the effective gain Geff, the effective gain Geff is calculated as a value obtained by dividing the output voltage V1 of the differential amplifier circuit 130 by the reference voltage Vref. When the effective gain Geff is calculated, at step S340, the controller 150 switches the third switch SW3 OFF such that the auxiliary power source 190 and the differential amplifier circuit 130 become disconnected.

Referring back to FIG. 2, when the power-key 180 is not turned on, or when step S220 of detecting the effective gain Geff has been finished, the controller 150 detects a temperature T of the differential amplifier circuit 130 by the temperature detector 195 at step S225, and subsequently compares the detected temperature T with a predetermined temperature Ts at step S230. When the detected temperature T of the differential amplifier circuit 130 is higher than the predetermined temperature Ts according to the temperature comparison, the controller 150 detects the effective gain Geff of the differential amplifier circuit 130 at step S240. The value of the effective gain Geff may vary each time that the step S240 is executed. The temperature T of the differential amplifier circuit 130 is compared with the predetermined temperature Ts because resistivity of a resistor varies sensitively to its temperature. That is, such a temperature comparison is required for obtaining actual gain of the differential amplifier circuit 130, because the temperature T of the differential amplifier circuit 130 may vary during the driving of the electric vehicle. The predetermined temperature Ts may be obviously set to an appropriate value by a person skilled in the art, taking into account characteristics of resistors used in the differential amplifier circuit 130.

Step S240 of detecting the effective gain Geff is executed according to the steps shown in FIG. 3 in the same way as in the step S220. When the detected temperature T of the differential amplifier circuit 130 is not above the predetermined temperature Ts, or when the effective gain Geff is detected at step S240, the controller 150 applies the voltage of the battery module 115 to the input terminals 140 of the differential amplifier circuit 130 at step S250.

Step S250 of applying the battery module voltage is achieved by switching the first switching circuit SC1 ON (SC1-ON) and the second switching circuit SC2 OFF (SC2-OFF). According to the present embodiment, the second switching circuit SC2 is already switched OFF at step S220 or step S240 (refer to the step S340 in FIG. 3), and therefore, only the switching of the first switching circuit SC1 ON is required at step S250. For that effect, the controller 150 switches the first switch ON (SW1-ON) and the second switch OFF (SW2-OFF) at step S255, waits for a predetermined period in the state of SW1-ON and SW2-OFF at step S260, and switches the first switch OFF (SW1-OFF) and the second switch ON (SW2-ON). According to the steps S255-S265, The voltage of the battery module 115 is applied to the differential amplifier circuit 130 via the capacitor C1, and accordingly, voltage interference between the battery module 115 and the differential amplifier circuit 130 is prevented. The predetermined period may be obviously set to an appropriate value by a person in the art taking into account of the capacitance of the capacitor C1, of which an exemplary value may be approximately 10 msec.

When the voltage of the battery module 115 is applied to the differential amplifier circuit 130, the controller 150 detects an output voltage V0 of the differential amplifier circuit 130 supplied with the battery module voltage at step S270. Subsequently, the controller 150 switches the second switch SW2 OFF at step S275 such that both the switches SW1 and SW2 are in the OFF state.

Subsequently at step S280, the controller 150 calculates a voltage value V of the battery module 115 by modifying the output voltage V0 of the differential amplifier circuit on the basis of the effective gain Geff. At the step S280, the voltage value V is obtained by multiplying the output voltage V0 of the differential amplifier circuit 130 by the effective gain Geff.

When step S280 for calculating the actual output voltage V is finished, the controller 150 determines at step S290 whether the power-key 180 is turned off. When power-key 180 is turned off, the method for measuring the battery voltage according to the present embodiment is finished. When the power-key 180 is not turned off, the controller 150 proceeds to step S225 of detecting the temperature T of the differential amplifier circuit 130, and accordingly, the series of steps S225 to S280 are repeatedly executed until the power-key 180 is turned off.

According to a preferred embodiment of the present invention, an actual voltage of a battery module may be accurately measured regardless of change of resistivity of a resistor in the differential amplifier circuit. The accuracy is enhanced because an actual effective gain of the differential amplifier circuit is obtained by using a reference voltage of an auxiliary power source. Actual effective gain of the differential amplifier circuit can be obtained based on the relationship between a reference voltage and an output voltage of the differential amplifier circuit therefrom. Such a relationship is precisely studied and obtained as shown above. A battery module and the differential amplifier circuit are interconnected by capacitor coupling such that interference therebetween may be minimized. The effective gain is measured whenever the power-key is turned on and the temperature of the differential amplifier circuit is higher than a predetermined temperature. So, the effective gain used by the controller may remain as close as possible to an actual gain.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An apparatus for measuring a value of a battery module voltage, the battery module being included in a modularized battery of an electric vehicle, the apparatus comprising:

a differential amplifier circuit for outputting a modified voltage difference, the differential amplifier having input terminals and at least one resistor, the modified voltage difference being obtained by modifying a voltage difference inputted through the input terminals on the basis of a gain according to the resistivity of the at least one resistor;

an auxiliary power source for outputting a reference voltage;

a first switching circuit for controlling applying of the battery module voltage to the input terminals;

a second switching circuit for controlling applying of the auxiliary power source to the input terminals; and a controller for calculating the value of the battery module voltage on the basis of an output voltage from the differential amplifier circuit, wherein the controller performs:

detecting a variable effective gain of the differential amplifier circuit;

applying the battery module voltage to the input terminals of the differential amplifier circuit;

detecting the output voltage of the differential amplifier circuit that is applied with the battery module voltage; and calculating the value of the battery module voltage by modifying the output voltage of the differential amplifier circuit on the basis of the effective gain.

2. The apparatus of claim 1, wherein the detecting of a variable effective gain comprises:
   switching the first switching circuit OFF (SC1-OFF) and the second switching circuit ON (SC2-ON);
   detecting an output voltage of the differential amplifier circuit in the state of SC1-OFF and SC2-ON; and
   calculating the effective gain of the differential amplifier circuit on the basis of the detected output voltage.

3. The apparatus of claim 2, wherein the calculating of the effective gain calculates the effective gain as a value obtained by dividing the output voltage of the differential amplifier circuit by the reference voltage.

4. The apparatus of claim 1, wherein the applying of the battery module voltage switches the first switching circuit ON (SC1-ON) and the second switching circuit OFF (SC2-OFF).

5. The apparatus of claim 4, wherein:
   the first switching circuit comprises a capacitor, a first switch for controlling the connection between the capacitor and the battery module, and a second switch for controlling the connection between the capacitor and the input terminals; and
   the applying of the battery module voltage comprises:
   switching the first switch ON (SW1-ON) and the second switch OFF (SW2-OFF);
   waiting for a predetermined period in the state of SW1-ON and SW2-OFF; and
   switching the first switch OFF (SW1-OFF) and the second switch ON (SW2-ON).

6. The apparatus of claim 1, wherein the calculating of the value of the battery module voltage calculates the effective gain as a value obtained by multiplying the output voltage of the differential amplifier circuit by the effective gain.

7. The apparatus of claim 1, further comprising a power-key for controlling supplying of electric power to an electric load of the electric vehicle, wherein the controller detects the effective gain of the differential amplifier circuit at least when the power-key is turned on.

8. The apparatus of claim 1, further comprising a temperature detector for detecting a temperature of the differential amplifier circuit, wherein:
   the controller further performs detecting the temperature of the differential amplifier circuit and comparing the detected temperature with a predetermined temperature; and
   the detecting of the effective gain is performed at least when the detected temperature is above the predetermined temperature.

9. The apparatus of claim 1, wherein the differential amplifier circuit comprises a differential amplifier;
   the input terminals of the differential amplifier circuit comprises first and second input terminals;
   the first and second input terminals of the differential amplifier circuit are connected to first and second terminals of the differential amplifier interposing first and second resistors, respectively;
   an output terminal of the differential amplifier is connected to the first input terminal interposing a third resistor; and
   the second input terminal of the differential amplifier is grounded interposing a fourth resistor.

10. A method for measuring a value of a battery module voltage using a differential amplifier circuit for outputting a modified voltage difference, the battery module being included in a modularized battery of an electric vehicle, the differential amplifier having input terminals and at least one resistor, the modified voltage difference being obtained by modifying a voltage difference inputted through the input terminals on the basis of a gain according to the resistivity of the at least one resistor, the method comprising:
   detecting a variable effective gain of the differential amplifier circuit;
   applying the battery module voltage to the input terminals of the differential amplifier circuit;
   detecting the output voltage of the differential amplifier circuit that is applied with the battery module voltage; and
   calculating the value of the battery module voltage by modifying the output voltage of the differential amplifier circuit on the basis of the effective gain.

11. The method of claim 10, wherein the detecting of the variable effective gain comprises:
   applying the reference voltage to the input terminals of the differential amplifier circuit;
   detecting an output voltage of the differential amplifier circuit while the reference voltage is applied; and
   calculating the effective gain of the differential amplifier circuit on the basis of the detected output voltage.

12. The method of claim 11, wherein the calculating of the effective gain calculates the effective gain as a value obtained by dividing the output voltage of the differential amplifier circuit by the reference voltage.

13. The method of claim 10, wherein:
   the applying of the battery module voltage includes using a capacitor, a first switch for controlling the connection between the capacitor and the battery module, and a second switch for controlling the connection between the capacitor and the input terminals; and
   the applying of the battery module voltage comprises:
   switching the first switch ON (SW1-ON) and the second switch OFF (SW2-OFF);
   waiting for a predetermined period in the state of SW1-ON and SW2-OFF; and
   switching the first switch OFF (SW1-OFF) and the second switch ON (SW2-ON).

14. The method of claim 10, wherein the calculating of the value of the battery module voltage calculates the effective gain as a value obtained by multiplying the output voltage of the differential amplifier circuit by the effective gain.

15. The method of claim 10, further comprising determining if a power-key for controlling supplying of electric power to an electric load of the electric vehicle is turned on, wherein the controller detects the effective gain of the differential amplifier circuit at least when the power-key is turned on.

16. The method of claim 10, further comprising detecting the temperature of the differential amplifier circuit and comparing the detected temperature with a predetermined temperature, wherein the detecting of the variable effective gain is performed at least when the detected temperature is above the predetermined temperature.

* * * * *